United States Patent [19]

Hester

[11] Patent Number: 4,831,381
[45] Date of Patent: May 16, 1989

[54] CHARGE REDISTRIBUTION A/D CONVERTER WITH REDUCED SMALL SIGNAL ERROR

[75] Inventor: Richard K. Hester, Whitewright, Tex.

[73] Assignee: Texas Instruments Incorporated, Dallas, Tex.

[21] Appl. No.: 84,277

[22] Filed: Aug. 11, 1987

[51] Int. Cl.[4] .......................................... H03K 13/02
[52] U.S. Cl. .................................. 341/172; 341/162; 341/163
[58] Field of Search ................ 340/347 AD, 347 DA, 340/347 C, 347 NT

[56] References Cited

U.S. PATENT DOCUMENTS 4,200,863  4/1980  Hodges ........................ 340/347 AD
4,381,496  4/1983  Carter ......................... 340/347 AD Primary Examiner—Bernard Roskoski
Attorney, Agent, or Firm—Stanton C. Braden; James T. Comfort; Melvin Sharp

[57] ABSTRACT

An A/D converter utilizing a charge redistribution scheme includes a single ended comparator and associated therewith a capacitor array of binary weighted capacitors. The input signal is sampled with the input of the comparator disposed at a point midway between ground and a unipolar reference voltage. The bottom plates of the capacitors in the hold mode are then disposed at the midpoint of the reference signal. In the redistribution mode, the value of the bits is determined by switching the bottom plates of the capacitors between the midpoint of the reference voltage and either ground or the full value of the reference voltage. The input signal during sampling is attenuated by sampling it onto only one-half of the array.

11 Claims, 2 Drawing Sheets

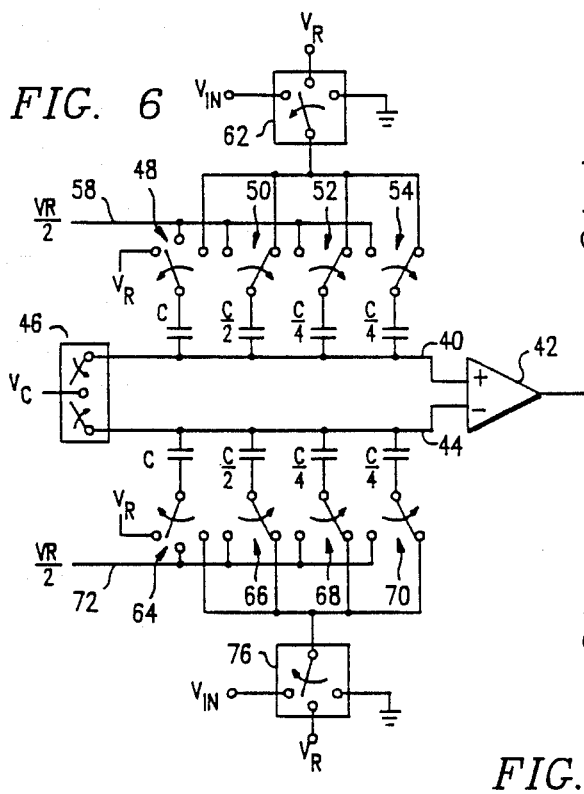

CHARGE REDISTRIBUTION A/D CONVERTER WITH REDUCED SMALL SIGNAL ERROR

TECHNICAL FIELD OF THE INVENTION

The present invention pertains in general to A/D converters and, more particularly, to charge redistribution A/D converters for converting bipolar signals with a single unipolar reference.

CROSS REFERENCE TO RELATED APPLICATIONS

The present invention is related to United States patent application Ser. No. 084,276, filed Aug. 11, 1987.

BACKGROUND OF THE INVENTION

Analog-to-digital and digital-to-analog converters have been described in the past utilizing a simple solution that is based on the periodic charging and discharging of a capacitor. These are sometimes referred to as Shannon-Rack decoders. These types of decoders employ a constant current source that is utilized to charge a capacitor through a switch. For the digital-to-analog conversion, the output on the capacitor, after a number of switching cycles, represents the analog value. A clock is necessary to synchronize the operation of the decoder in conjunction with the binary input. A weighting factor is provided during each interval of time that the capacitor is charged and discharged to ensure that the capacitor voltage is halved each half-period through discharging. Due to practical problems such as timing and the need of high precision and low-drift components, as well as a serial digital input, such a converter has never been widely utilized.

A modern version of the concept of charge weighting used in the Shannon-Rack decoder which is tailored for monolithic integration is the concept of a charge redistribution decoder. In this decoder, intermediate results are stored dynamically with minimum losses on high-precision capacitors (e.g., MOS capacitors), and are moved from one capacitor to another by MOSFET switches. One of the more widely utilized charge redistribution converter techniques is based on successive approximation. This technique primarily utilizes capacitors having binary weighted values with the top plate of all the capacitors connected to one input of a comparator and the bottom plate switched between various voltages. The steering of the various switches is controlled by the comparator through auxiliary logic circuitry.

The conversion process is essentially performed in three steps, a sampling step, a hold step and a redistribution step. In the sampling step, the top plates of the capacitors are normally connected to ground, or some suitable sample reference voltage, and the bottom plates to the input voltage. This results in a stored voltage on the bottom plate which is proportional to the input voltage. In the hold step, the top plate is electrically isolated and the bottom plates are normally connected to ground or some suitable hold reference voltage. Since the charge on the top plate is conserved, its potential goes to the negative of the input voltage. In the conversion or "redistribution" step, each individual bit is tested by sequentially connecting the bottom plate of each of the capacitors to either a redistribution reference voltage or to ground until the voltage on the top plate reaches a predetermined voltage. This is usually the trip point of the comparator.

One disadvantage of a charge redistribution converter is incurred when sampling positive and negative signals. Typically, during the hold or reset step, all of the bottom plates of the capacitors are set to a predetermined hold reference voltage, such as ground. This results in the top plates being pulled above or below the trip point of the comparator. For example, if the hold reference voltage is equal to zero volts or ground and only a single unipolar redistribution reference $V_R$ is available for the bottom plate switching during the redistribution step, the top plate can be pulled positive only toward $V_R$, and only positive input signals can be converted. This is true for any array that utilizes only two levels (i.e., a unipolar reference and ground) wherein the top plates are preset to one of the other during the hold or reset step. A problem arises when a negative voltage is sampled, resulting in a positive voltage on the top plates in the hold step, which requires a negative redistribution reference voltage during redistribution. Therefore, a bipolar reference voltage is required when sampling a bipolar input signal.

This disadvantage can be cured by setting half the array to either $V_R$ or zero and setting the other half of the array to the other of the two levels. However, one disadvantage to this technique is that the capacitor associated with the most significant bit (MSB) is equal to half the capacitance of the array. Testing of this bit occurs for analog values around zero. If the capacitor is not equal to exactly one-half the total capacitance of the array, a significant differential nonlinearity can be incurred. This is not a problem for A/D converters of the order of three bits, but this can be a problem for A/D converters of ten bits or higher. Generally, the MSB capacitor of an N-bit array must equal half the total capacitance within one part in $2^N$ to avoid the differential non-linearity. This conversion error occurs because the major bit transition occurs at zero signal. Therefore, a need exists for an A/D converter that utilizes ground and a unipolar reference and can redistribute the charge in the capacitor array without requiring a major bit transition to be at the zero signal level. The errors caused by the MSB capacitor size then occur at a larger input signal and are thus a small fraction of that signal.

SUMMARY OF THE INVENTION

The present invention disclosed and claimed herein comprises a capacitor array of binary weighted capacitors for receiving a sampled input analog voltage for sampling across the array and subsequent redistribution on the array. The capacitors in the array have a common top plate and individual lower plates. In a sample mode, the lower plates of the capacitors are connected such that a voltage proportional to the input analog signal is sampled onto the capacitors in the array. In a hold mode, the lower plates of the capacitors are connected to a hold reference voltage that is between ground and a unipolar reference such that the voltage on each of the capacitors is equal and proportional to the sample input analog voltage. The charge is then redistributed in a redistribution mode across the capacitors by connecting the bottom plates of select ones of the capacitors to either the unipolar reference voltage, the predetermined hold reference voltage or ground in accordance with a predetermined successive approximation technique, such that the voltage on the upper plates of the capacitors is equal to the predetermined reference voltage after redistribution.

In another embodiment of the present invention, the input voltage is only sampled across one-half of the total capacitance in the capacitor array. This results in the voltage level during redistribution being one-half of the initial sample voltage level of the input signal. In one embodiment, the capacitors representing the most significant bit in the capacitor array are connected to a separate voltage reference with the remaining capacitors having the lower plates thereof connected to the sampled input analog signal, the most significant bit capacitor representing one-half of the capacitance in the array.

In yet another embodiment of the present invention, the redistribution of charge in the array utilizes circuitry to determine the sign of the input analog signal and a sign bit generated indicative of the positive or negative sign of the input signal. The bottom plates of the capacitors in the array are then switched between the unipolar reference and the hold reference voltage for a positive input analog signal and between the hold reference voltage and ground for a negative input analog signal.

In yet another embodiment of the present invention, the hold reference voltage is one-half the voltage of the unipolar reference voltage. A comparator is provided for comparing the voltage on the upper plates of the capacitor with the hold reference voltage to determine if the voltage on the upper plates of the capacitors is higher or lower than the hold reference voltage. The output of the comparator is input to successive approximation control circuitry to determine the orientation of the voltage on the bottom plates of the capacitors during redistribution.

BRIEF DESCRIPTION OF THE DRAWINGS

For a more complete understanding of the present invention and the advantages thereof, reference is now made to the following description taken in conjunction with the accompanying Drawings in which:

FIG. 6 illustrates an alternate embodiment of the present invention utilizing a fully differential capacitor array for receiving bipolar signals;

FIG. 7 illustrates a simplified schematic diagram of the differential A/D converter of FIG. 6 illustrating the capacitors in the positive and negative array and the amplifier 42 with the bottom plates of the capacitors configured in the hold mode;

FIG. 8 illustrates a simplified schematic diagram of the capacitor array in the hold mode;

FIG. 9 illustrates a simplified schematic diagram of the capacitor array in the redistribution mode; and FIG. 10 illustrates an adaptation of the fully differential A/D converter utilizing the resistor-capacitor hybrid converter of the Fotouhi type where the MSBs select the taps of the resistor string that are used as the reference inputs to the capacitor arrays.

DETAILED DESCRIPTION OF THE INVENTION

Figure 1:
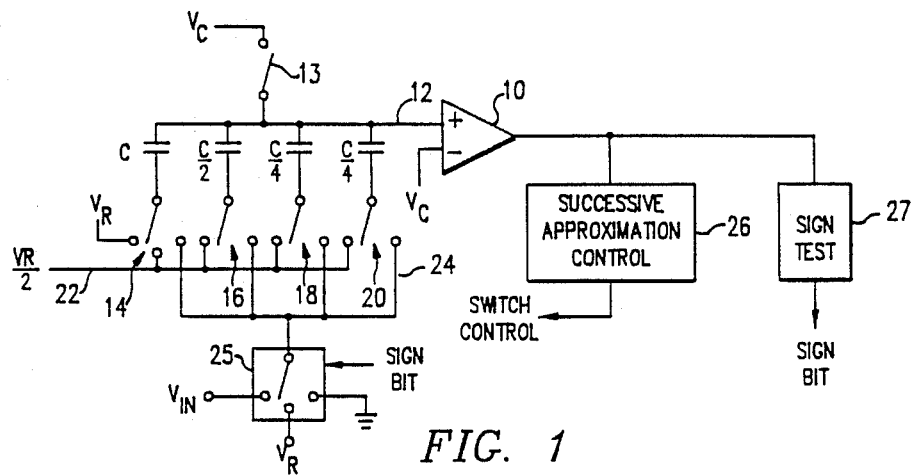
FIG. 1 illustrates a schematic block diagram of a single ended charge redistribution A/D converter utilizing the present invention.

Referring now to FIG. 1, there is illustrated a schematic diagram of a single-ended charge redistribution Analog-to-Digital (A/D) converter utilizing the present invention. The A/D converter of FIG. 1 is comprised of a comparator 10 with the negative input thereof connected to a reference voltage $V_C$ and the positive input thereof connected to a capacitor array of binary weighted capacitors. By way of example, a three bit A/D converter will be described. The capacitors have the binary weighted values $C, C/2, \ldots, C/2^{n-1}$. There are two capacitors having the value of $C/2^{n-1}$, so the total capacitance of the $n+1$ capacitors is $2C$. In the three bit example, the capacitors are valued at $C$, $C/2$, $C/4$ and $C/4$.

Each of the capacitors in the array has the top plate thereof connected to a common top plate 12 with the bottom plates of each of the capacitors $C$, $C/2$, $C/4$ and $C/4$ connected to switches 14, 16, 18 and 20, respectively. A switch 13 is provided for selectively connecting the top plate 12 to a voltage. The switch 14 connected to capacitor $C$ is operable to receive three inputs, with the remainder of the switches 16–20 operable to receive two inputs. One input of the switch 14, and one input of the switches 16–20, are connected to a bottom reference line 22 which is connected to the reference voltage $V_R/2$. In a similar manner, one input of the switch 14, and the remaining inputs of the switches 16–20, are connected to a line 24. The line 24 is connected to the output of a switch 25, switch 25 operable to switch between a sample input voltage $V_{IN}$, a reference voltage $V_R$ and ground. The switch 14 has one remaining input that is connected to the reference voltage $V_R$. It should be noted that only a unipolar reference $V_R$ and ground are provided.

The output of the comparator 10 is connected to the input of a successive approximation control circuit 26, the output of which provides switch control signals operable to control the state of all the switches 13–20 and 25. The successive approximation control 26 is operable to sense the output state of the comparator 10. For example, if the voltage on the top plate 12 of the capacitor array is above $V_C$, the output of the comparator 10 will be a logic "1". Conversely, if the voltage on the top plate 12 of the capacitor array is below $V_C$, the output of comparator 10 will be a logic "0". In the redistribution mode, the relationship of the voltage of the top plate 12 to the capacitor array is sensed on the output of the comparator 10 to determine whether the bit being tested is a logic "1" or a logic "0". The switches 13–20 and 25 typically utilize MOS switches. The general operation of redistribution A/D converters and the successive approximation control circuit 26 is described in U.S. Pat. No. 4,399,426, issued Aug. 16, 1983 to Khen-Sang Tan, which patent is incorporated herein by reference.

A sign bit test circuit 27 is connected on the output of the amplifier 10 to determine the sign of the input signal. A sign bit is output therefrom which is a logic "0" for a positive signal, and a logic "1" for a negative signal. The sign bit controls the switch 25 such that only $V_R$ can be selected for a logic "0" sign bit and ground can be selected for a logic "1" sign bit. Although not shown, the sign bit test circuit 27 can be realized with a two position switch that selects for output therefrom either $V_R$ or ground. This two position switch is latched when the sign of the input signal is determined. The switch 25 is then controlled to select $V_{IN}$ during the sample mode and the output of the two position switch during the redistribution mode, as will be described in more detail hereinbelow.

Figure 2:
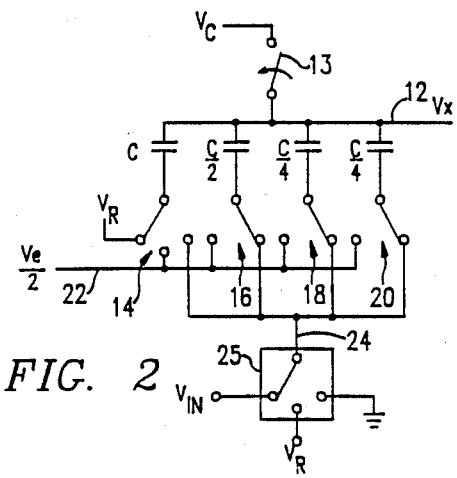
FIG. 2 illustrates a partial schematic diagram of the array in the sample mode.

Referring now to FIG. 2, there is illustrated a partial schematic diagram of the capacitor array of FIG. 1 with the switches 13–20 and 25 configured to place the A/D converter in the sample mode. Like numerals refer to like parts in the various figures. Switch 13 is connected to apply ground to the top plate 12. The voltage on top plate 12 is referred to as $V_X$ which, in the sample mode, is equal to ground. The bottom plate of the capacitor C has the reference voltage $V_R$ applied thereto by switch 14, and switches 16–20 are connected to line 24. Switch 25 is connected to apply the sampled voltage $V_{IN}$ to the plate 24. Therefore, $V_{IN}$ is applied across capacitors C/2, C/4 and C/4 and the voltage $V_R$ is applied to the capacitor C. In this manner, in the hold mode the input voltage $V_{IN}$ is effectively attenuated to one-half its value.

Figure 3:
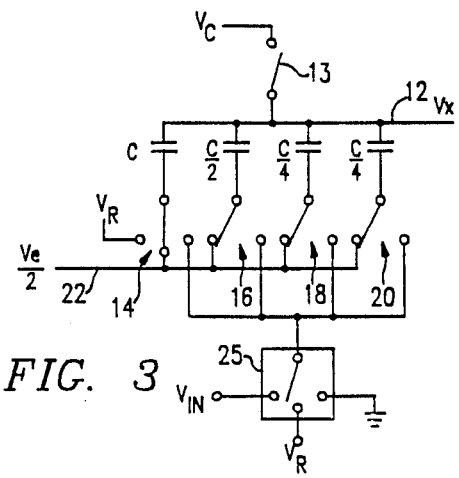
FIG. 3 illustrates a partial schematic diagram of the capacitor array of FIG. 1 in the hold mode for testing for the sign bit.

Referring now to FIG. 3, there is illustrated a partial schematic diagram of the A/D converter of FIG. 1 in the hold mode. In this mode, the upper plate 12 is disconnected from the sample reference voltage $V_C$ by opening switch 13 and the bottom plates of the capacitors connected to line 22 to apply the voltage $V_R/2$ thereto by appropriately configuring switches 14–20. Since charge is conserved, the voltage from the upper plate 12 is increased by one-half the difference between $V_R/2$ and $V_{IN}$ and one-half the difference between $V_R/2$ and $V_R$. The voltage $V_X$ is as follows:

$$V_X = V_C - \tfrac{1}{2} V_{IN}$$

It is important to note that only one-half of the input signal magnitude appears at the top plate 12 because it was sampled on only one-half of the array. The top plate 12 can be varied by at most $+/-V_R/2$. If the input signal were not attenuated to one-half its value, the input signal would be limited to the range $+/-V_R/2$. For example, if the voltage $V_R$ were equal to 5 volts in a five volt comparator, a positive voltage could swing from zero to $+2.5$ volts and a negative voltage could swing from zero to $-2.5$ volts. However, if the input signal were attenuated as illustrated in FIGS. 1–3, this would allow the full five volt swing for both the positive and negative input voltages.

It is necessary in the hold mode to test for the sign bit. This is performed by the logic in the sign bit test circuit 27. If the signal is positive such that $V_{IN}$ is greater than zero, it will be necessary in the redistribution mode to distribute the charge such that the voltage on the top plate 12 increases, approaching the reference voltage $V_C$. This will be done by switching the bottom plates of the capacitors between $V_R/2$ and $V_R$. However, if the voltage $V_{IN}$ is less than zero, the switching on the bottom plates of the capacitors in the redistribution mode will occur between $V_R/2$ and zero. As described above, the sign bit output from the sign bit test circuit 27 determines whether switch 25 switches from $V_{IN}$ to $V_R$ or from $V_{IN}$ to ground.

Figure 4:
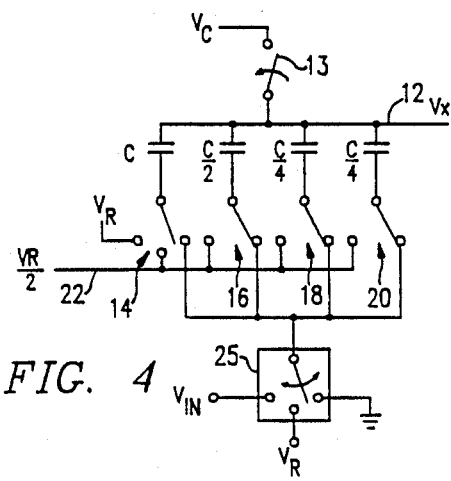
FIG. 4 illustrates a partial schematic diagram of the capacitor array when testing the most significant bit.

Referring now to FIG. 4, there is illustrated a partial schematic diagram of the A/D converter illustrating the capacitor array with the switches configured for testing the MSB. This is the first step in the redistribution mode. The switch 14 associated with the bottom plate of the C capacitor is connected to the line 24 to allow it to interface with the switch 25. The switch 25 is connected to either the reference voltage $V_R$ or ground, depending upon the sign bit.

If the sampled input voltage is greater than zero, the switch 25 is connected to $V_R$ such that $V_R$ is connected to the bottom plate of the C capacitor. This will raise the voltage on the upper plate 12 of the capacitor array by a value of $\tfrac{1}{4} V_R$ resulting in the following equation:

$$V_X = V_C - \tfrac{1}{2} V_{IN} + \tfrac{1}{4} V_R$$

If the value of $V_X$ is less than $V_C$, the MSB is equal to a logic "1". However, if $V_X$ is greater than $V_C$, the MSB is equal to a logic "0". For a logic "1", the switch 14 is connected to the line 24 such that $V_R$ is disposed on the bottom plate of the capacitor C and, if $V_X$ is greater than $V_C$, the switch 14 is disposed at $V_R/2$.

If the sign bit indicates a negative value, the switch 25 is disposed at ground. This reduces the voltage on the upper plate 12 of the capacitors by a value of $\tfrac{1}{4} V_R$ resulting in the following equation:

$$V_X = V_C - \tfrac{1}{2} V_{IN} - \tfrac{1}{4} V_R$$

If $V_X$ is less than $V_C$, the MSB is a logic "1", and, if $V_X$ is greater than $V_C$, the MSB is a logic "0". A logic "1" results in the switch 14 being connected to the line 24 to maintain a zero voltage on the bottom plate of the C capacitor and, a logic "0" results in the switch 14 being positioned at the $V_R/2$ voltage on line 22.

After the MSB associated with the C capacitor is tested, the next MSB is tested until all switches 14–20 have been successfully tested by the successive approximation control 26 and the appropriate voltage disposed on the bottom plates of the capacitors. It is important to note that the switching varies the voltage on the upper plate 12 of the capacitors in the array by a value of plus or minus $V_R/2$. Therefore, the input signal ranges from $-V_R$ to $+V_R$. Further, for a bipolar input signal, the zero value of the sampled input signal requires switching of the C/4 capacitors in the array as opposed to switching of the larger C capacitor which represents the MSB of the digital word. The larger C capacitors are switched when the input signal is greater than $V_R/2$ or less than $-V_R/2$, so the associated differential nonlinearity is much less significant.

Figure 5:
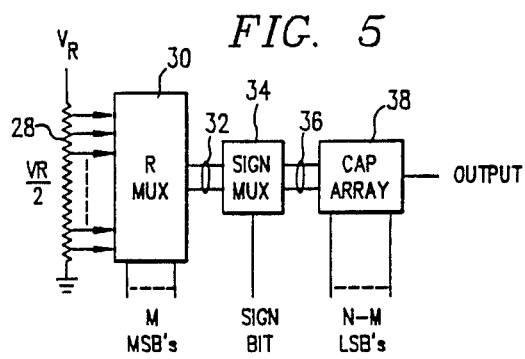
FIG. 5 illustrates a schematic block diagram of one system for deriving the $V_R/2$ reference voltage.

Referring now to FIG. 5, there is illustrated a schematic block diagram of one system for deriving the $V_R/2$ voltage. This system utilizes a Fotouhi type converter which employs two Digital-to-Analog (D/A) converters, a single resistor string and one capacitor array. This is described in B. Fotouhi and D. Hodges, "High Resolution A/D Conversion in MOS/LSI", IEEE J. of *Solid State Circuits*, Vol. 14, Number 6 (December 1979) pages 920–925. The converter utilizes a resistor string 28 which has $2^M$ taps such that an equal resistance is disposed between adjacent taps throughout the entire resistor string 28. These taps are input to a multiplexer 30 which is operable to select any two adjacent taps from ground up to $V_R$. One of these taps automatically selects the value $V_R/2$ for input to the line 22 of the capacitor array. The multiplexer 30 outputs the two adjacent tapped voltages onto two lines 32 for input to a sign multiplexer 34. The signal multiplexer 34 receives the sign bit and is operable to reverse the position of the two tapped voltages on lines 32 for output on two lines 36. The two lines 36 have an input to the capacitor array which is referred to by a reference numeral 38 for application to the switch 25 in place of the voltages $V_R$ and ground.

In operation, the multiplexer 30 for selecting the tapped voltages from the resistor string 28 is controlled by the MSBs. The taps are successively selected until the output of the comparator 10 changes logic states. This occurs during the redistribution step. If there are M MSBs and N-M LSBs, the M MSBs are input to the multiplexer 30 and the LSBs are input into the capacitor array 38, such that the capacitor array is only utilized to determine the LSBs. Once the MSBs have been selected to reduce the voltage $V_X$ on the top plates of the capacitor array 38 to a range which can then be controlled by switching the lower plates of the capacitors, the LSBs are then determined by switching the lower plates of the capacitors between the two voltages on the lines 36 and redistributing the charge.

Referring now to FIG. 6, there is illustrated an alternate embodiment of the present invention utilizing a fully differential capacitor array for receiving bipolar signals. This type of array is described more fully in copending patent application Ser. No. 084,276, filed Aug. 11, 1987. The capacitor array is comprised of a positive array and a negative array, each array having binary weighted capacitors. By way of example, the differential A/D converter of FIG. 6 is a three bit array having capacitors C, C/2, C/4 and C/4. The top plates of the positive array are connected to a common top plate 40 for connection to the positive input of a differential amplifier 42. The capacitors in the negative array share a common top plate 44 for input to the negative input of the differential amplifier 42. The positive and negative inputs of the amplifier 42 are connected to $V_C$ through switches 46 during the sample mode.

The bottom plates of each of the capacitors C, C/2, C/4 and C/4 in the positive array are connected to switches 48, 50, 52 and 56, respectively. Switches 48–56 are similar to switches 14–20 of FIG. 1. Switch 48 is operable to be connected to either $V_R$, a line 58 connected to $V_R/2$ or a line 60. Line 60 is connected through a switch 62 to either the positive side of the sampled input voltage $V_{IN+}$, $V_R$ or ground. Switches 50–56 are connected to either the line 58 or the line 60.

The capacitors C, C/2, C/4 and C/4 of the negative array have the bottom plates thereof connected to switches 64, 66, 68 and 70, respectively. Switches 64–70 are similar to switches 48–56 in the positive array. The switch 64 is operable to connect the bottom plate of capacitor C to either reference voltage $V_R$, a line 72 connected to $V_R/2$ or a line 74. Line 74 is operable to be connected through a switch 76 to either the negative side of the sampled input voltage $V_{IN-}$, $V_R$ or ground. The output of operational amplifier 42 is connected to a successive approximation logic circuit (not shown) which is operable to determine the switch configurations.

Referring now to FIG. 7, there is illustrated a simplified schematic diagram of the differential A/D converter of FIG. 6 illustrating the capacitors in the positive and negative arrays and the amplifier 42, with the bottom plates of the capacitors configured in the hold mode. The switches in the illustration of FIG. 6 are depicted in the sample mode wherein $V_{IN+}$ is disposed on the bottom plates of the capacitors C/2, C/4 and C/4 of the positive array, and $V_{IN-}$ is disposed on the bottom plates of the capacitors C/2, C/4 and C/4 of the negative array. The MSB capacitors C have reference voltage $V_R$ disposed on the bottom plates thereof. In the hold mode, the upper plates 40 of the capacitors in the positive array have a voltage $V_{X+}$ disposed thereon and the upper plates 44 of the capacitors in the negative array have a voltage $V_{X-}$ disposed thereon, in accordance with the following equations:

$$V_{X+} = V_C - \tfrac{1}{2} V_{IN+}$$

$$V_{X-} = V_C - \tfrac{1}{2} V_{IN-}$$

The sign bit is tested in the hold mode to determine whether there is a positive or a negative bipolar signal disposed on the input terminals $V_{IN+}$ and $V_{IN-}$. For a positive signal, the bottom plates of the capacitors in the negative array are switched between $V_R/2$ and ground, and the bottom plates of the capacitors in the positive array are switched between $V_R/2$ and $V_R$. For a negative signal, the bottom plates of the capacitors in the positive array are switched between ground and $V_R/2$ and the bottom plates of the capacitors in the negative array are switched between $V_R/2$ and $V_R$. The case for a positive signal when testing the MSB will result in the following voltage relationship for $V_{X+}$ and $V_{X-}$:

$$V_{X+} = V_C - \tfrac{1}{2} V_{IN+} + \tfrac{1}{4} V_R$$

$$V_{X-} = V_C - \tfrac{1}{2} V_{IN-} - \tfrac{1}{4} V_R$$

When testing for the MSBs, the voltage on the output of the amplifier 42 is measured and a determination is made as to whether the differential voltage is less than zero. If it is less than zero, the MSB is equal to "1". If, however, the differential voltage is greater than zero, the MSB is equal to zero. The differential voltage must be within the range of $-V_R$ and $+V_R$. The switch configuration for the MSB test for the positive signal is illustrated in FIG. 8 and the switch configuration for the MSB test for the negative signal is illustrated in FIG. 9.

Referring now to FIG. 10, there is illustrated an adaptation of the fully differential A/D converter utilizing the resistor-capacitor hybrid converter of the Fotouhi type where the MSBs are selecting the taps of the resistor string that are used as the reference inputs to the capacitor arrays. A resistor string 78 is connected between $V_R$ and ground and has a tap provided therefrom for the voltage $V_R/2$. In addition, there are a plurality of taps output therefrom with an equal resistance disposed therebetween. This provides finite increments of voltage. These taps are input to a resistor multiplexer 80 for selecting and outputting two sets of voltages, each representing two adjacent taps. There are two adjacent high voltage taps $V_{H+}$ $V_{L+}$ and two adjacent low voltage taps $V_{L-}$ and $V_{H-}$. In general, the multiplexer 80 is operable to first output the two uppermost taps on resistor string 78 and the two lower most taps on the resistor string 78 and then sequentially move the taps toward each other such that the differential voltage is decreased.

The output of the multiplexer 80 is input to a sign multiplexer 82 which receives a sign bit. The sign multiplexer 82 outputs two high voltage taps $V_{0+}$ and $V_{1+}$ and two low voltage taps $V_{0-}$ and $V_{1-}$. The two positive taps are input to the bottom plates of the capacitors in the positive array through the switch 62 (not shown) in the redistribution mode with switches 48 and 56 selecting between the two taps. The two positive voltages $V_{1+}$ and $V_{0+}$ correspond to the voltages $V_R$ and ground that are input to switch 62. In a similar manner, the two output taps $V_{0-}$ and $V_{1-}$ of the sign multiplexer 82 are input through switch 76 (not shown) to switches 64–70 for connection to the lower plates of the capacitors of the negative array. The successive approximation circuit for the LSBs is operable to redistribute the charge on the capacitors after the MSBs have been determined such that the LSBs can be determined by the redistribution operation.

When the sign is positive, the sign multiplexer performs the following interconnection:

$$V_{1-} = V_{H+}$$

$$V_{0+} = V_{L+}$$

$$V_{0-} = V_{L-}$$

$$V_{1-} = V_{H-}$$

For a negative signal, the following relationship exists:

$$V_{1-} = V_{L-}$$

$$V_{0+} = V_{H-}$$

$$V_{0-} = V_{H+}$$

$$V_{1-} = V_{L+}$$

In summary, there has been provided an A/D converter which is operable to convert a bipolar input signal to a digital value with a unipolar reference voltage. The lower plates of the capacitors are reset to a voltage midway between the reference voltage and ground during the hold mode. For small positive and negative signals, the LSB capacitors are switched. The MSB capacitors are only switched for large negative and positive values. This prevents the bit transition of the MSB capacitor from occurring at small input signal levels. Further, the input voltages are sampled onto only one-half of the array in order to increase the range of the input voltage. The bottom plates of the capacitors, during the redistribution mode, are switched between the midpoint of the reference voltage and either the reference voltage or ground.

Although the preferred embodiment has been described in detail, it should be understood that various changes, substitutions and alterations can be made therein without departing from the spirit and scope of the invention as defined by the appended claims.

What is claimed is:

1. A redistribution A/D converter, comprising:
   a capacitor array of binary weighted capacitors, each of said capacitors having a lower and an upper plate with the upper plate of each of said capacitors being common;
   sample means for sampling an input analog voltage on said capacitor array such that charge is stored in said capacitor said sample means comprising a plurality of switches, each of said switches associated with the bottom plate of one of said capacitors and operable during sampling by said sampling means, the one of said switches associated with the largest of the capacitors in said capacitor array operable to connect the bottom plate thereof to said predetermined reference voltage, and the remaining of said switches associated with the remaining of said capacitors in said array operable to connect the output of said capacitors to said input analog voltage such that the input voltage is attenuated by a factor of two, said sample means operable to selectively connect the upper plates of said capacitors to said predetermined hold reference voltage during sampling by said sample means;
   hold means for connecting the lower plates of said capacitors to a predetermined hold reference voltage during a predetermined hold time after sampling by said sample means, said predetermined hold reference voltage being between ground and a unipolar reference voltage, such that the voltage on the upper plates of each of said capacitors is equal and offset from said hold reference voltage; and
   redistribution means for redistributing the charge in said capacitor array after the voltage on the upper plates of said capacitors is offset by said hold means by connecting the bottom plate of select ones of said capacitors to either said unipolar reference, said predetermined hold reference voltage or ground in accordance with a predetermined successive approximation technique such that the voltage on the upper plate of said capacitors is equal to said predetermined hold reference voltage after all of said capacitors have the bottom plates thereof selectively connected.

2. A redistribution A/D converter, comprising:
   a capacitor array of binary weighted capacitors, each of said capacitors having a lower and an upper plate with the upper plate of each of said capacitors being common;
   sample means for sampling an input analog voltage on said capacitor array such that charge is stored in said capacitors proportional to said input analog voltage;
   hold means for connecting the lower plates of said capacitors to a predetermined hold reference voltage during a predetermined hold time after sampling by said sample means, said predetermined hold reference voltage being between ground and a unipolar reference voltage, such that the voltage on the upper plates of each of said capacitors is equal and offset from said hold reference voltage; and
   redistribution means for redistributing the charge in said capacitor array after the voltage on the upper plates of said capacitors is offset by said hold means by connecting the bottom plate of select ones of said capacitors to either said unipolar reference, said predetermined hold reference voltage or ground in accordance with a predetermined successive approximation technique such that the voltage on the upper plate of said capacitors is equal to said predetermined hold reference voltage after all of said capacitors have the bottom plates thereof selectively connected, said redistribution means comprising sign means for determining the sign of the input analog signal and generating a sign bit indicative of the sign of the input analog signal, a plurality of redistribution switches associated with the bottom plates of said capacitors and each operable to connect the bottom plate of said associated capacitor to either said unipolar reference voltage or said hold reference voltage when said sign bit indicates a positive input analog signal, or to either ground or said unipolar reference voltage when said sign bit indicates a negative input analog signal, a comparator for comparing the voltage on the upper plate of said capacitors with said hold reference voltage to determine if the voltage on the upper plates of said capacitors is higher or lower than said hold reference voltage, and successive approximation circuitry for controlling said plurality of redistribution swithces for controlling the operation of said redistribution switches and the orientation thereof in accordance with said predetermined successive approximation technique to redistribute the charge on the said capacitors until the voltage on the upper plates thereof is approximately equal to said hold reference voltage.

3. A redistribution A/D converter, comprising:
   a capacitor array of binary weighted capacitors, each of said capacitors having an upper plate and a lower plate with the upper plates of each of said capacitors being common;
   a unipolar reference voltage;
   a midpoint reference voltage equal to one-half of said unipolar reference voltage;
   a ground reference voltage;
   first switch means for connecting the common upper plate of each of said capacitors to ground and interfacing said lower plates to a sampled input analog voltage to impress a voltage proportional to said input analog voltage across said capacitors in said array, said first switch means operable in a sample mode;
   sign means for sampling the analog input voltage to determine whether the analog input voltage is positive or negative and generating a sign bit having first and second logic states indicative of whether the analog input voltage is positive or negative, respectively;
   second switch means for connecting the lower plates of said capacitors in said array to said midpoint voltage, said second switch means operable in a hold mode after sampling in the sample mode;
   third switch means operable in a redistribution mode after operation of said second switch means in said hold mode, said third switch means operable to connect the lower plates of each of said capacitors to either said reference voltage or said midpoint reference voltage in response to said sign bit indicating a positive analog input voltage, and operable to connect the lower plates of said capacitors to either said midpoint reference voltage or ground in response to said sign bit indicating a negative input analog voltage;
   a comparator for comparing the voltage on the common upper plate of said capacitors with said midpoint reference voltage to determine if the voltage on the common upper plates is greater or less than said midpoint reference voltage and outputting a corresponding output signal; and
   successive approximation means operable to control said third switch means in said redistribution mode in accordance with a predetermined successive approximation technique to distribute the charge in the array until the voltage on said common upper plate is approximately equal to said midpoint reference voltage.

4. The A/D converter of claim 3 wherein said first switch means is operable in the sample mode to connect the lower plate of the most significant bit capacitor to said reference voltage and to connect the lower plate of the remaining of said capacitors to the sample input analog voltage such that the sampled input analog signal is sampled on only one-half of the capacitance in said array.

5. The A/D converter of claim 3 wherein said second switch means comprises a plurality of switches, each switch associated with the lower plate of one of said capacitors in said array and connected on one end thereof to the lower plate of the associated one of said capacitors and to the other end thereof to said midpoint reference voltage.

6. The A/D converter of claim 3 wherein said third switch means comprises:
   multiplexer means for receiving on the input thereof said reference voltage, said midpoint reference voltage and ground and for outputting either said midpoint reference voltage and said reference voltage in response to said sign bit indicating a positive input analog voltage, and outputting said midpoint reference voltage and ground in response to said sign bit indicating a negative analog voltage; and
   a plurality of switches each associated with one of said capacitors in said array and each operable to connect the lower plate of said associated capacitor with either of the two outputs from said multiplexer means under control of said successive approximation means.

7. A method for converting analog signals to digital signals, comprising:
   providing a capacitor array of binary weighted capacitors with each of the capacitors having a common upper plate and an individual lower plate;
   sampling an input analog signal onto the array, said step of sampling comprising connecting the lower plates of the capacitors representing one-half of the capacitance in the array to the sampled input analog voltage and the upper plates thereof to ground, with the upper plates of the remaining capacitors in the array connected to ground and the lower plates thereof connected to the unipolar reference voltage;
   disposing the lower plate of the capacitors at a predetermined hold reference voltage having a voltage between ground and a unipolar reference voltage, such that the voltage across each of the capacitors is equal and proportional to the sampled input analog voltage; and
   redistributing the charge on the capacitors in the array by connecting the bottom plates on select ones of the capacitors to either the unipolar reference, the predetermined hold reference voltage or ground in accordance with a predetermined successive approximation technique such that the voltage on the upper plate of the capacitors is equal to the predetermined hold reference voltage.

8. A method for converting analog signals to digital signals, comprising:
   providing a capacitor array of binary weighted capacitors with each of the capacitors having a common upper plate and an individual lower plate;
   sampling an input analog signal onto the array;
   disposing the lower plate of the capacitors at a predetermined hold reference voltage having a voltage between ground and a unipolar reference voltage, such that the voltage across each of the capacitors is equal and proportional to the sampled input analog voltage; and redistributing the charge on the capacitors in the array by connecting the bottom plates on select ones of the capacitors to either the unipolar reference, the predetermined hold reference voltage or ground in accordance with a predetermined successive approximation technique such that the voltage on the upper plate of the capacitors is equal to the predetermined hold reference voltage, said step of redistributing the charge in the capacitors comprising determining the sign of the analog input voltage and generating a sign bit indicative of the sign of the input analog signal, selectively connecting the bottom plate of each of the capacitors in the array to either the unipolar reference voltage or the hold reference voltage when the sign bit indicates a positive input analog signal, or selectively connecting the bottom plate of each of the capacitors to the hold reference voltage or ground when the sign bit indicates a negative input signal, comparing the voltage on the upper plate of the capacitors with the hold reference voltage to determine if the voltage on the upper plate is higher or lower than the hold reference voltage, and applying a successive approximation technique responsive to the output comparison value to control the selective connection of the bottom plates of the capacitors to either the unipolar reference voltage or ground in accordance with the successive approximation technique.

9. A redistribution A/D converter, comprising:

a capacitor array of binary weighted capacitors, each of said capacitors having a lower and an upper plate with the upper plate of each of said capacitors being common;

sampling circuitry operable for sampling an input analog voltage on said capacitor array such that charge is stored in said capacitor proportional to said input analog voltage said sampling circuitry comprising a plurality of switches, each of said switches associated with the bottom plate of one of said capacitors and operable during sampling by said sampling circuitry, the one of said switches associated with the largest of the capacitors in said capacitor array operable to connect the bottom plate thereof to said predetermined reference voltage, and the remaining of said switches associated with the remaining of said capacitors in said array operable to connect the output of said capacitors to said input analog voltage such that the input voltage is attenuated by a factor of two, said sampling circuitry operable to selectively connect the upper plates of said capacitors to said predetermined hold reference voltage during sampling by said sampling circuitry;

hold voltage circuitry operable for connecting the lower plates of said capacitors to a predetermined hold reference voltage during a predetermined hold time after sampling by said sampling circuitry, said predetermined hold reference voltage being between ground and a unipolar reference voltage, such that the voltage on the upper plates of each of said capacitors is equal and offset from said hold reference voltage; and redistribution circuitry operable for redistributing the charge in said capacitor array after the voltage on the upper plates of said capacitors is offset by said hold voltage circuitry by connecting the bottom plate of select ones of said capacitors to either said unipolar reference, said predetermined hold reference voltage or ground in accordance with a predetermined successive approximation technique such that the voltage on the upper plate of said capacitors is equal to said predetermined hold reference voltage after all of said capacitors have the bottom plates thereof selectively connected.

10. A redistribution A/D converter, comprising:

a capacitor array of binary weighted capacitors, each of said capacitors having a lower and an upper plate with the upper plate of each of said capacitors being common;

sample circuitry operable for sampling an input analog voltage on said capacitor array such that charge is stored in said capacitors proportional to said input analog voltage;

hold voltage circuitry operable for connecting the lower plates of said capacitors to a predetermined hold reference voltage during a predetermined hold time after sampling by said sampling circuitry, said predetermined hold reference voltage being between ground and a unipolar reference voltage, such that the voltage on the upper plates of each of said capacitors is equal and offset from said hold reference voltage; and redistribution circuitry operable for redistributing the charge in said capacitor array after the voltage on the upper plates of said capacitors is offset by said hold voltage circuitry by connecting the bottom plate of select ones of said capacitors to either said unipolar reference, said predetermined hold reference voltage or ground in accordance with a predetermined successive approximation technique such that the voltage on the upper plate of said capacitors is equal to said predetermined hold reference voltage after all of said capacitors have the bottom plates thereof selectively connected, said redistribution means comprising sign means for determining the sign of the input analog signal and generating a sign bit indicative of the sign of the input analog signal, a plurality of redistribution switches associated with the bottom plates of said capacitors and each operable to connect the bottom plate of said associated capacitor to either said unipolar reference voltage or said hold reference voltage when said sign bit indicates a positive input analog signal, or to either ground or said unipolar reference voltage when said sign bit indicates a negative input analog signal, a comparator for comparing the voltage on the upper plate of said capacitors with said hold reference voltage to determine if the voltage on the upper plates of said capacitors is higher or lower than said hold reference voltage, and successive approximation circuitry for controlling said plurality of redistribution switches for controlling the operation of said redistribution switches and the orientation thereof in accordance with said predetermined successive approximation technique to redistribute the charge on the said capacitors until the voltage on the upper plates thereof is approximately equal to said hold reference voltage.

11. A redistribution A/D converter, comprising:

a capacitor array of binary weighted capacitors, each of said capacitors having an upper plate and a lower plate with the upper plates of each of said capacitors being common;
a unipolar reference voltage;
a midpoint reference voltage equal to one-half of said unipolar reference voltage;
a ground reference voltage;
first switch for connecting the common upper plate of each of said capacitors to ground and interfacing said lower plates to a sampled input analog interfacing said lower plates to a sampled input analog voltage to impress a voltage proportional to said input analog voltage across said capacitors in said array, said first switch means operable in a sample mode;
sign determining circuit for sampling the analog input voltage to determine whether the analog input voltage is positive or negative and generating a sign bit having first and second logic states indicative of whether the analog input voltage is positive or negative, respectively;
second switch for connecting the lower plates of said capacitors in said array to said midpoint voltage, said second switch means operable in a hold mode after sampling in the sample mode;
third switch operable in a redistribution mode after operation of said second switch means in said hold mode, said third switch means operable to connect the lower plates of each of said capacitors to either said reference voltage or said midpoint reference voltage in response to said bit indicating a positive analog input voltage, said operable to connect the lower plates of said capacitors to either said midpoint reference voltage or ground in response to said bit indicating a negative input analog voltage;
a comparator for comparing the voltage on the common upper plate of said capacitors with said midpoint reference voltage to determine if the voltage on the common upper plates is greater or less than said midpoint reference voltage and outputting a corresponding output signal; and
successive approximation circuitry operable to control said third switch means in said redistribution mode in accordance with a predetermined successive approximation technique to distribute the charge in the array until the voltage on said common upper plate is approximately equal to said midpoint reference voltage.

* * * * *